United States Patent [19]

Schubert

[11] Patent Number: 4,948,456
[45] Date of Patent: Aug. 14, 1990

[54] CONFINED LATERAL SELECTIVE EPITAXIAL GROWTH

[75] Inventor: Peter J. Schubert, Kokomo, Ind.

[73] Assignee: Delco Electronics Corporation, Kokomo, Ind.

[21] Appl. No.: 364,399

[22] Filed: Jun. 9, 1989

[51] Int. Cl.⁵ .................... C30B 23/04; C30B 25/04; H01L 21/308
[52] U.S. Cl. .................... 156/611; 156/613; 156/DIG. 64; 156/DIG. 111; 148/DIG. 26; 437/90; 437/78; 437/927
[58] Field of Search ............... 156/610, 611, 612, 613, 156/614, DIG. 64, DIG. 111; 148/DIG. 85, DIG. 44, DIG. 26, DIG. 150; 437/89, 90, 927, 84, 78, 85, 93

[56] References Cited

U.S. PATENT DOCUMENTS

| | | | |
|---|---|---|---|
| 3,961,999 | 6/1976 | Antipov | 148/DIG. 85 |
| 3,966,514 | 6/1976 | Feng et al. | 148/DIG. 85 |
| 4,449,285 | 5/1984 | Janes et al. | 437/93 |
| 4,696,095 | 10/1987 | Thomas | 437/78 |

OTHER PUBLICATIONS

Schubert, P. et al., "A New Epitaxy Technique for Device Isolation and Advanced Device Structures", to be presented at the University/Government/Industry-Microelectronics Symposium, Jun. 12-14, 1989 Westborough, Mass.

Friedrich, J. A. et al., "The Dependence of Silicon Selective Epitaxial Growth Rates on Masking Oxide Thickness", Journal Applied Physics, vol. 65, No. 4, Feb. 15, 1989, pp. 1713-1716.

Friedrich, J. A. et al., "Interface Characterization of Silicon Epitaxial Lateral Growth Over Existing SiO₂ for Three-Dimensional CMOS Structures", IEEE Electron Device Letters, vol. 10, No. 4, Apr. 1989, pp. 144-146.

Cullen, G. W. et al., "The Characterization of CVD Single-Crystal Silicon on Insulators: Heteroepitaxy and Epitaxial Lateral Overgrowth", Journal of Crystal Growth, vol. 65, (1983) pp. 415-438.

Borland, J. O. et al., "Advanced Dielectric Isolation Through Selective Epitaxial Growth Techniques", Solid State Technology, Aug. 1985, pp. 141-148.

Baerg, W. et al., "A Seeded-Channel Silicon-on-Insulator (SOI) MOS Technology", IEEE Electron Device Letters, vol. EDL-6, No. 12, Dec. 1985, pp. 668-670.

Ohwada, K. et al., "A High-Speed Buried Channel MOSFET Isolated by an Implanted Silicon Dioxide Layer", IEEE Transactions on Electron Devices, vol. ED-28, No. 9, Sep. 1981, pp. 1084-1087.

Ishiwara, H. et al., "Lateral Solid Phase Epitaxy in Selectively P-Doped Amorphous Si Films", Applied Physics Letters, vol. 49, No. 20, Nov. 17, 1986, pp. 1363-1365.

Siekkinen, J. W. et al., "Selective Epitaxial Growth Silicon Bipolar Transistors for Material Characterization", IEEE Transactions on Electron Devices, vol. 35, No. 10, Oct., 1988, pp. 1640-1644.

Friedrich, J. A. et al., "Limitations in Low-Temperature Silicon Epitaxy Due to Water Vapor and Oxygen in the Growth Ambient", Applied Physics Letters, vol. 53, No. 25, Dec. 19, 1988, pp. 2543-2545.

Primary Examiner—Gary P. Straub
Attorney, Agent, or Firm—Domenica N. S. Hartman

[57] ABSTRACT

A method is disclosed for forming laterally grown epitaxial silicon without the requirement for subsequent thinning or planarization of the epitaxial silicon. Generally a low, wide cavity consisting of walls of dielectric material and having a side opening, or via hole, is formed and the epitaxial silicon is then selectively grown within the cavity. The resulting epitaxial silicon structure is characterized by being flat and wide with an aspect ratio of approximately 6 to 1.

3 Claims, 3 Drawing Sheets

CONFINED LATERAL SELECTIVE EPITAXIAL GROWTH

This invention generally relates to semiconductor fabrication techniques which utilize selective epitaxial growth techniques. More particularly, this invention relates to a method for forming selectively grown epitaxial silicon within a confined structure so as to provide a thin, wide region of laterally grown epitaxial silicon.

BACKGROUND OF THE INVENTION

Selective epitaxial growth techniques in the semiconductor fabrication industry are known. The use of selective epitaxial growth techniques is advantageous because it enables devices to be more closely spaced, yet still electrically independent of each other. This is accomplished by growing the epitaxial silicon from the single crystal silicon substrate through a seed hole which has been provided in a surrounding layer of dielectric material formed upon the substrate. The surrounding dielectric layer subsequently provides dielectric isolation between semiconductor devices formed on the epitaxial silicon.

Generally, the selectively grown epitaxial silicon has been formed in the following manner. A silicon substrate is first covered with an electrically insulating layer, typically silicon dioxide. This silicon dioxide layer subsequently forms the dielectric isolation layer. A seed hole is patterned in this silicon dioxide layer so as to expose the underlying silicon substrate within the seed hole. Using appropriate conditions of gas compositions, temperature and pressure, epitaxial silicon may be grown on the exposed substrate within the seed hole. No growth occurs on the surrounding silicon dioxide layer. This results in epitaxial silicon filling the seed hole to form a planar surface with the silicon dioxide layer. The silicon dioxide layer prevents signal leakage laterally between epitaxial silicon regions (or, perhaps, the devices formed in them). However, a shortcoming of this method is that leakage paths from the epitaxial silicon still exist through the underlying silicon substrate.

A technique has been proposed by the art to prevent these leakage paths through the underlying substrate using selective epitaxial growth techniques. This proposed method partially eliminates leakage paths through the substrate using epitaxial lateral overgrowth techniques. Epitaxial lateral overgrowth, or ELO, is simply selective epitaxial growth that is allowed to continue growing up and over the seed hole, and along the lateral surface of the surrounding dielectric layer. It is the lateral portions of epitaxial lateral overgrowth which are useful for forming devices because of the underlying oxide in those regions which provide dielectric isolation from the underlying silicon substrate. With this technique, there is still electrical continuity within the silicon regions through the seed hole. However, if desired, this may be eliminated by etching through the epitaxial silicon which overlies the seed hole.

The main shortcoming associated with epitaxial lateral overgrowth techniques is that it must be thinned by some means. The as-grown epitaxial lateral overgrowth is as tall as it is wide. However, most practical and useful devices require greater than five microns lateral distance and less than one micron vertical height for the silicon film to be feasible for forming devices. In order to form this desired structure, an etch-back or polishing step is required to thin the epitaxial silicon. This requirement for thinning of the laterally grown silicon is problematic because of the resulting poor uniformity across the substrate, low yields, non-standard equipment, and induced wafer stress.

In addition, another shortcoming associated with the conventional epitaxial lateral overgrowth techniques is that the seed hole must be located in the center of the epitaxial silicon region. There are many applications in circuit layout when it would be desirable to provide the seed hole in a region that is off-center.

It is therefore desirable to provide a method for forming laterally grown epitaxial silicon which does not require subsequent thinning, and which does not require the seed hole to be disposed in the center of the epitaxial silicon region. It is further desired that such a method be accomplished using standard semiconductor processing and manufacturing techniques.

SUMMARY OF THE INVENTION

It is an object of this invention to provide a method for forming laterally grown epitaxial silicon.

More specifically, it is an object of this invention that the seed hole may be provided anywhere in the epitaxial silicon film.

It is still a further object of this invention that such a method not require conventional subsequent thinning techniques.

In accordance with a preferred embodiment of this invention these and other objects and advantages are accomplished as follows.

A method is disclosed for forming laterally grown epitaxial silicon comprising the following steps. A single crystal silicon substrate is first provided. A first layer of dielectric material is then formed on a surface of the substrate. This first layer of dielectric material is patterned so as to provide a seed hole in this dielectric layer wherein the underlying single crystal silicon is exposed. Next, a layer of an appropriate sacrificial material is formed within the seed hole and upon the first layer of dielectric material. The sacrificial material is patterned so as to replicate the desired pattern of the subsequent laterally grown epitaxial silicon.

A second layer of dielectric material is then formed over and around the layer of sacrificial material so that the first and second layers of dielectric material completely surround the layer of sacrificial material except at the seed hole. A region of the sacrificial material is then selectively exposed by selectively removing the overlying region of the second layer of dielectric material in that region. The sacrificial material is then substantially, but not completely, surrounded by the first and second layers of dielectric material. This results in a structure of dielectric material similar to a cavity having a side opening, with the sacrificial material provided within the cavity structure. Next, the layer of sacrificial material is completely removed through the side opening of the cavity, so that the seed hole on the single crystal silicon substrate is exposed. Then, epitaxial silicon is selectively grown from the underlying silicon substrate through the seed hole within the substantially surrounding layers of dielectric material. The dielectric layers provide a cavity with confining walls for the epitaxial silicon to grow within, thereby resulting in a low, wide region of epitaxial silicon. Lastly, the overlying second layer of dielectric material may be selectively removed, so that the epitaxial silicon is exposed for the formation of devices. This last step is not always necessary, since it may be desirable at times to leave this second layer intact for use as an implant layer or diffusion mask.

An inventive feature of this method is that a low, wide region of epitaxial silicon is created using a cavity structure of dielectric material. This epitaxial silicon is grown from the substrate out of a seed hole provided deep within the cavity structure. The epitaxial growth is confined by the top wall of the cavity structure resulting in a wide, flat, single crystal film of silicon. The confining walls also permit the seed hole to be placed anywhere within the cavity structure.

Other objects and advantages of this invention will be better appreciated from a detailed description thereof, which follows.

DETAILED DESCRIPTION OF THE INVENTION

This preferred method is useful for forming laterally grown epitaxial silicon which does not require subsequent thinning to be feasible for the formation of devices. Alternative embodiments of the preferred method are detailed below. Generally in each embodiment a low, wide cavity having a side opening is first formed upon the silicon substrate using appropriate dielectric materials and a sacrificial layer which is subsequently removed to form the cavity. Epitaxial silicon is then grown selectively from the underlying silicon substrate, through a seed hole which is provided on the underlying substrate and within the cavity. This epitaxial growth is confined by the top wall, or ceiling, of the cavity, resulting in a wide, flat, single crystal film of epitaxial silicon.

The illustrative examples are as follows.

EXAMPLE 1

Figure 1A:
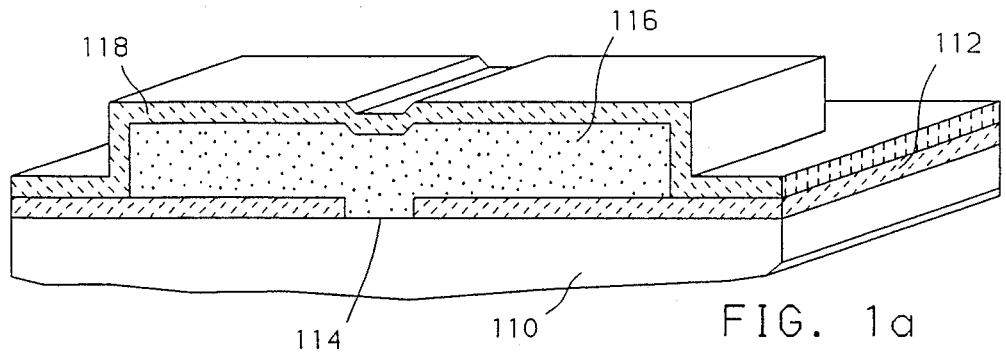
FIG. 1 is a three-dimensional view of the preferred processing steps in accordance with this invention for the formation of laterally grown epitaxial silicon.

As shown in FIG. 1a, a single crystal silicon substrate 110 is provided. A first insulating, or dielectric, layer 112 is then deposited on the silicon substrate 110 and patterned so that a seed hole 114 exposing the single crystal silicon substrate 110 is provided. It is preferred that this first dielectric layer 112 be formed from silicon nitride because of its good etch selectivity, ready availability and ease of use. A sacrificial layer 116 is then deposited on this first dielectric layer 112, and etched. The resulting dimensions of the sacrificial layer 116 will subsequently define the dimensions of the final laterally grown epitaxial silicon film. Because the sacrificial layer 116 will be subsequently etched away to form the desired cavity for growing the epitaxial silicon, it must be chosen from a material which will selectively etch more quickly than the dielectric materials used. A suitable material would be highly doped deposited oxide.

Figure 1B:
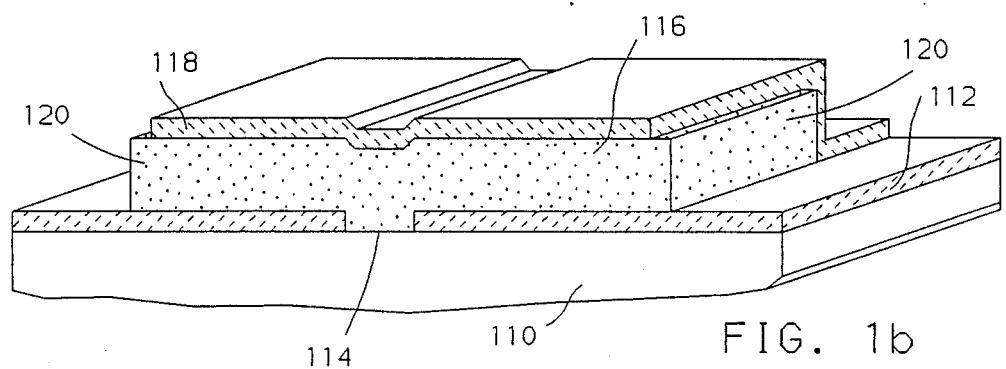

After the sacrificial layer 116 is patterned to form the desired shape of the cavity in which the epitaxial silicon will be grown, a second layer 118, or top layer, of dielectric material is deposited upon and around the sacrificial layer 116, so as to completely surround the sacrificial layer 116 except at the seed hole 114. As shown in FIG. 1b, a portion of this second dielectric layer 118 is removed so as to expose the underlying sacrificial layer 116, preferably using common etching techniques, to form a via hole 120. The via hole 120 is located relatively distant from the seed hole 114 in a lateral direction. At this point, the sacrificial layer 116 is surrounded by the dielectric layers 112 and 118 everywhere except at the via hole 120 and at the seed hole 114. It is preferred that this second dielectric layer 118 be also formed from a material such as silicon nitride, since it must be resistant to the subsequent etching conditions used for removal of the sacrificial layer 116.

It is to be noted that although this example discloses first and second dielectric layers 112 and 118 of nitride and a sacrificial layer of oxide, other equally preferred embodiments are foreseeable. An example being wherein the first and second dielectric layers 112 and 118 are formed from a high quality oxide, which forms a better interface with the silicon, and the sacrificial layer 116 is formed from plasma-enhanced deposited nitride or polysilicon.

Figure 1C:
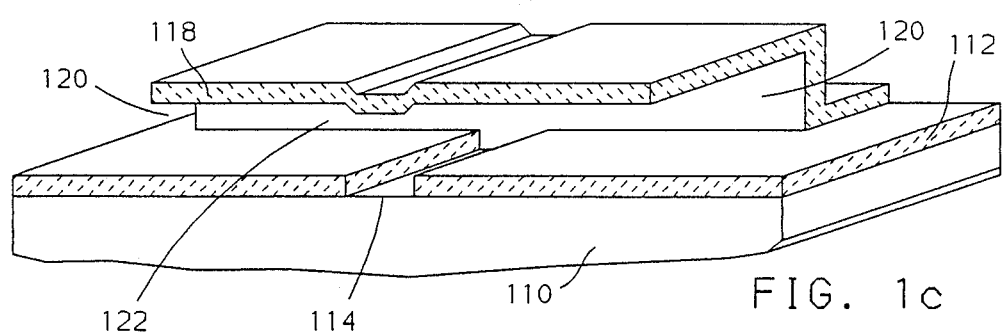

As shown in FIG. 1c, the sacrificial layer 116 is then selectively etched away through the via hole 120 in the second dielectric layer 118, to expose the the single crystal silicon substrate 110 within the seed hole 114. The result of this step is a cavity structure 122 with its opening at the via hole 120, and with a seed hole 114 deep within the cavity 122. This structure 122 provides a direct path for epitaxy gasses to flow from the via hole 120 and cause epitaxial growth from the seed hole 114. Using appropriate and conventional selective epitaxial growth techniques the cavity 122 is filled with single crystal silicon material. The preferred epitaxial growth conditions are as follows; an appropriate mixture of dichlorosilane and hydrogen chloride gases in a hydrogen carrier gas at approximately 950° C. and pressure less than approximately 150 Torr in either a barrel or pancake type epitaxy reactor.

Figure 1D:
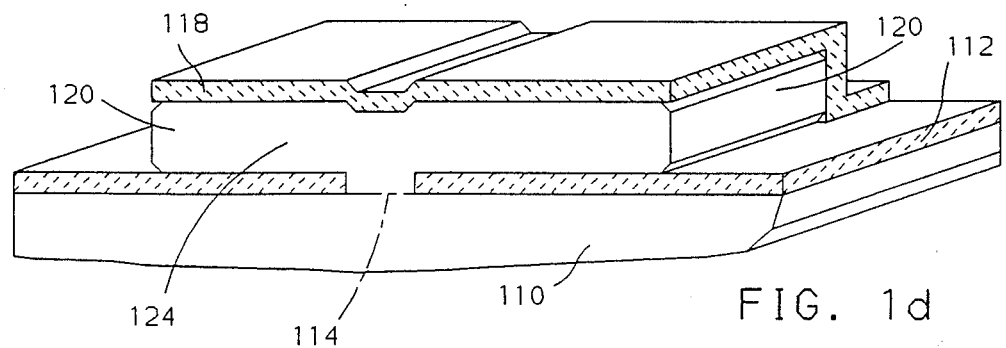

As shown in FIG. 1d, as the epitaxial growth silicon 124 encounters the second, or top, dielectric layer 118, the growth 124 is confined to proceed laterally along the surface of the first dielectric layer 112. The resulting single crystal epitaxial silicon 124 is characterized by being flat, thin and wide with an aspect ratio of approximately 6 to 1. Aspect ratios of greater than 8 to 1 have been obtained with films having only a height of about 1 micron. It is foreseeable that aspect ratios of up to about 25 to 1 could be obtained with this method. The final step for forming devices from the laterally grown epitaxial silicon 124 involves conventionally removing the second, or top, layer 118 of silicon nitride. It is to be noted that this top layer 118 does not necessarily have to be removed, since the top dielectric layer 118 may be used as a diffusion or implant mask, or as a "first dielectric layer" in a stacked device having subsequent confined selective lateral epitaxial growth.

Epitaxial silicon films produced in accordance with this manner show no difference in crystal orientation or degree of crytallinity when compared to both the substrate 110 silicon material or conventional films formed using epitaxial lateral overgrowth methods. Devices, such as diodes or bipolar transistors, have been formed with this method. An advantageous feature of this method is that the resulting device does not require thinning or planarization techniques, since the lateral growth techniques are confined within a cavity structure. This first illustrative example required the use of three masking steps, three film deposition steps, and one epitaxial growth step.

EXAMPLE 2

As shown in FIG. 2, the desired structure of laterally grown epitaxial silicon may also be formed using only a single mask step and two oxidization steps. As shown in FIG. 2a, a silicon substrate 210 which for exemplary purposes only is doped to be of a N+ conductivity type at its surface, has a P− conductivity type doped epitaxial layer 212 formed using conventional means upon it. This thickness of this P− epitaxial silicon layer 212 will approximately define the height of the final laterally grown selective epitaxial silicon film. This epitaxial layer 212 is then selectively oxidized to from an oxide layer 214 having a thickness of approximately one micron. The only mask step is then used to etch through this thick oxide layer 214. As shown in FIG. 2b, a selective silicon etch attacks the P− silicon layer 212 much faster then the underlying N+ silicon substrate 210, forming a cavity 216 beneath the thick oxide.

Figure 2A:
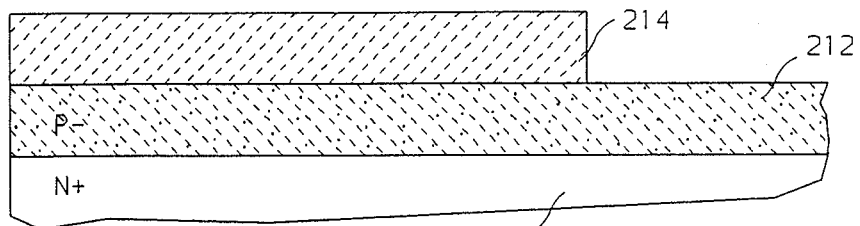
FIG. 2 is a cross sectional view of alternative preferred processing steps in accordance with this invention for the formation of laterally grown epitaxial silicon.
Figure 2B:
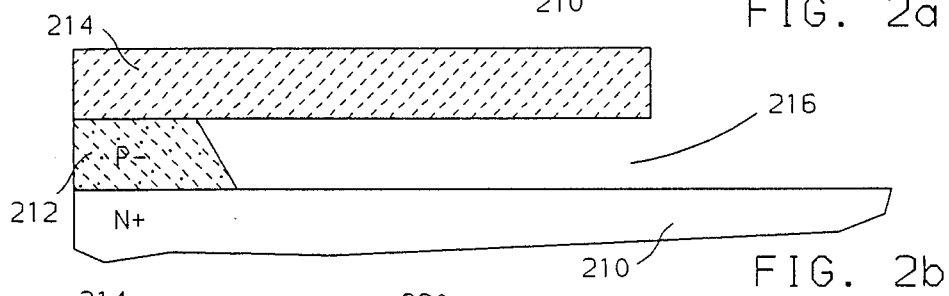
Figure 2C:
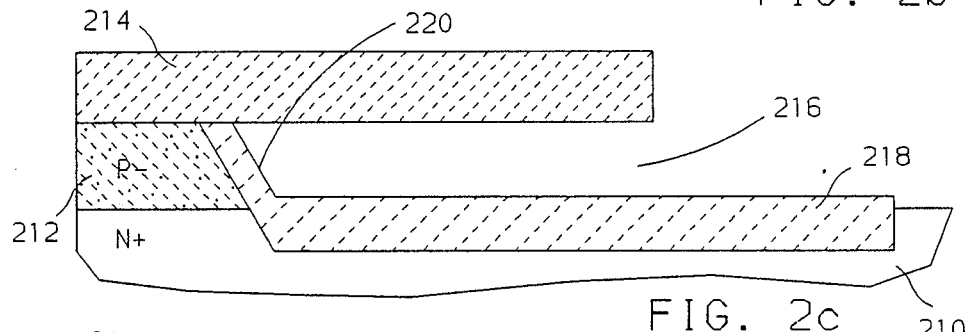
Figure 2D:
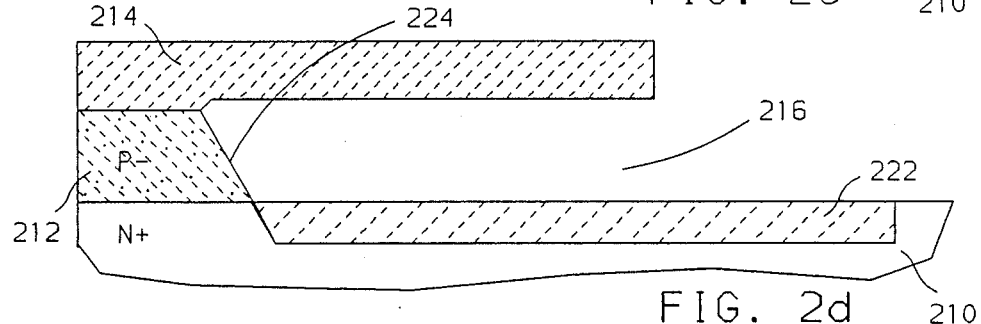
Figure 2E:
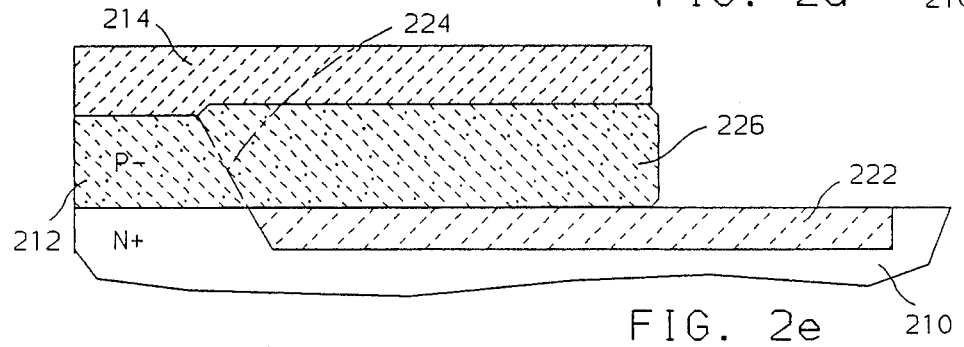

As shown in FIG. 2c, the wafer is then oxidized to form a second oxide layer 218 within the cavity 216. Because oxide growth depends on crystal orientation and doping levels and the conductivity of the silicon, the oxide layer 218 grown on the N+ silicon substrate 210 is thicker than that portion 220 on the exposed P− epitaxial type silicon layer 212. In view of this phenomena, a brief oxide etch will accordingly remove the thinner oxide portion 220 on the P− epitaxially grown layer 212, while leaving some oxide 222 behind on the N+ underlying silicon substrate 210, as shown in FIG. 2d. It is to be noted that the initial thick oxide layer 214, as shown in FIG. 2c, is etched from both sides, therefore it is desirable to form this oxide layer 214 of an appropriate thickness. Using this technique we have now formed a cavity 216 with dielectric walls 214 and 222 and a seed hole 224 provided by the epitaxial layer 212, to epitaxially grow the laterally grown epitaxial silicon 226 from the seed hole 224 within, as shown in FIGS. 2d and 2e. It is to be noted that the polarity, i.e., N or P type conductivity, of the doped substrate may be reversed if desired.

EXAMPLE 3

Figures 3A, 3B, 3C, 3D:
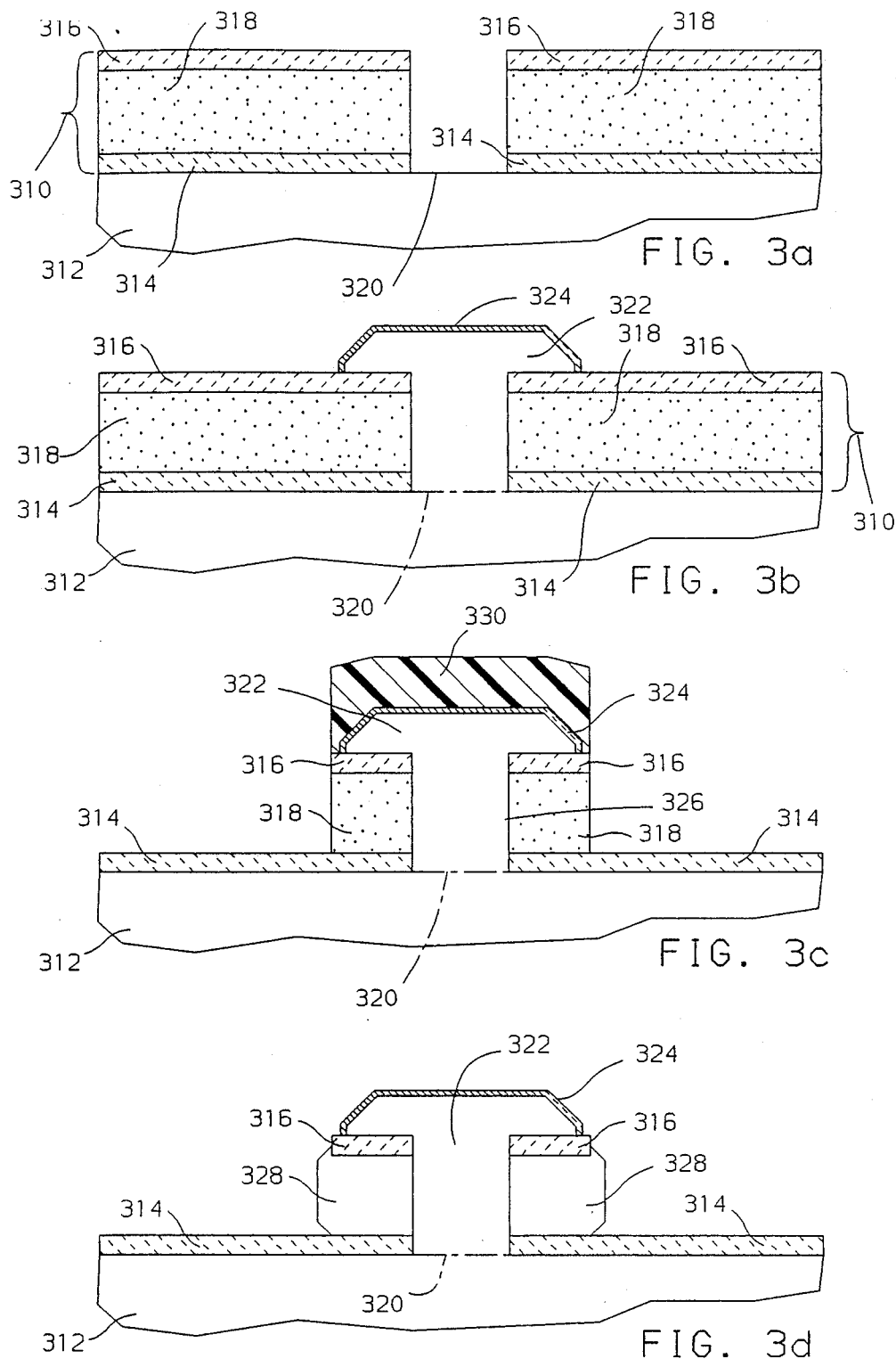
FIG. 3 is another cross sectional view of alternative preferred processing steps in accordance with this invention for the formation of laterally grown epitaxial silicon.

An alternative sequence of processing steps is illustrated in FIG. 3. As shown in FIG. 3a, a sandwiched structure 310 may first be formed on a single crystal silicon substrate 312, comprising three layers. The three layers preferably comprise two dielectric layers 314 and 316 as the outside layers and a center sacrificial layer 318. The preferred materials are oxide for the two dielectric layers 314 and 316 because it is highly desirable to provide an oxide interface with the epitaxial silicon and form the sacrificial layer 318 from nitride. It is very desirable to have oxide covering all walls of a cavity into which selective epitaxial silicon is grown. Two ways to do this are: (1) to oxidize the walls of the second layer before the first layer is etched to expose the substrate; or (2) use a sidewall spacer of oxide.

A seed hole 320 is then etched anisotropically through all three layers 314, 316 and 318 of the sandwich structure 310 exposing the underlying single crystal silicon substrate 312. This method requires a higher degree of care so as to prevent damage to the underlying substrate 312 during the relatively long etch required to etch through the three layers 314, 316 and 318. The seed hole 320 is then filled using conventional techniques with selective epitaxially grown silicon and overgrown slightly to form a mushroom 322 shaped silicon structure, as shown in FIG. 3b. The top surface of this mushroom shaped epitaxial silicon structure 322 is then oxidized so as to form an oxide layer 324. Next, the top layer 316 is conventionally masked 330 so as to cover only the mushroom shaped epitaxial silicon 322 and a region extending slightly beyond the mushroom structure 322. This mask step can be eliminated by using a selective etch of the top layer 316, wherein the etch would be advantageously self-aligned to the edge of the mushroom 322. The exposed top dielectric layer 316 and center sacrificial layer 318 of the sandwiched structure 310 are then selectively and anisotropically etched away, as shown in FIG. 3c. Then, as shown in FIG. 3d, the sacrificial layer 318 which contacts the selectively grown mushroom structure 322 or stalk (sidewall) 326 of that mushroom 322 is selectively etched away to expose the side of the epitaxially grown stalk region of the mushroom. The top and bottom dielectric layers 314 and 316, respectively, then form the cavity into which is grown the laterally grown selective epitaxial single crystal silicon 328.

In summary, this preferred method, which is embodied in the above illustrative examples, for forming laterally grown, thin and wide, epitaxial silicon is advantageous in that it permits various types of cavity geometries so as to provide a variety of resulting epitaxial silicon structures. The degree of crystallinity of these confined laterally grown selective epitaxial silicon films is comparable to the crystallinity of the underlying silicon substrate or conventionally grown epitaxial films. However a significant advantage associated with this method is that the desired lateral shape and degree of crystallinity are obtained without the need for thinning or planarizing.

It is foreseeable that a transistor could be formed using this preferred method with only a single mask step. Various other applications are foreseeable because of the dielectric isolation capabilities which are possible. With this method, a simple etch at the seed hole region is all that is necessary to separate and completely isolate the laterally grown epitaxial silicon regions from the substrate, hence many types of devices may be formed in this dielectrically isolated silicon. Therefore, while the invention has been described in terms of a preferred embodiment, it is apparent that other forms could be adopted by others skilled in the art such as the use of alternative materials or the formation of various types of transistors and devices. Accordingly the scope of our invention is to be limited only by the following claims.

The embodiments of the invention in which an exclusive property or privilege is claimed are defined as follows:

1. A method for forming laterally grown epitaxial silicon comprising the following steps:
   providing a single crystal silicon substrate;
   forming a first layer of dielectric material on a surface of said substrate;
   patterning said first layer of dielectric material so as to provide a seed hole in said layer of dielectric material wherein said underlying single crystal silicon is exposed;

forming a layer of a sacrificial material upon said patterned first layer of dielectric material and within said seed hole;

forming a second layer of dielectric material over and around said layer of sacrificial material so that said first and second layers of dielectric material substantially surround said layer of sacrificial material yet a portion of said underlying sacrificial material is exposed;

removing said layer of sacrificial material so as to form a cavity having walls defined by said first and second layers of dielectric material and so as to expose said single crystal silicon substrate within said seed hole, said cavity being characterized by an aspect ratio no greater than about 8 to 1 for a height of said cavity no greater than about 1 micron; and selectively growing epitaxial silicon from said single crystal silicon substrate through said seed hole and within said cavity.

2. A method for forming laterally grown epitaxial silicon comprising the following steps:

providing a single crystal silicon substrate of appropriate electrical conductivity type;

forming a first layer of dielectric material on said surface of said substrate;

patterning said first layer of dielectric material so as to provide a seed hole in said layer of dielectric material wherein said underlying single crystal silicon is exposed;

forming a layer of a sacrificial material upon said first layer of dielectric material and within said seed hole;

forming a second layer of dielectric material over and around said layer of sacrificial material so that said first and second layers of dielectric material substantially surround said layer of sacrificial material;

selectively removing a region of said second layer of dielectric material so as to expose said underlying layer of sacrificial material in that region and so that a structure of said second layer of dielectric material remains, said first and second layers of dielectric material substantially surround said layer of sacrificial material;

removing said layer of sacrificial material within said structure so as to expose said single crystal silicon substrate within said seed hole; and growing epitaxial silicon from said single crystal silicon substrate through said seed hole within said structure of dielectric material, said epitaxial grown silicon being characterized by an aspect ratio not greater than about 8 to 1 for a height of said epitaxially grown silicon of no greater than about 1 micron.

3. A method for forming laterally grown epitaxial silicon comprising the following steps:

providing a single crystal silicon substrate;

forming a sandwiched structure upon said single crystal silicon substrate, said sandwiched structure comprising top and bottom dielectric layers and an intermediate sacrificial layer;

patterning said sandwiched structure to provide a seed hole on said single crystal silicon substrate;

growing epitaxial silicon from said single crystal silicon substrate through said seed hole so as to form a mushroom shaped silicon structure;

selectively removing portions of said top dielectric layer and said sacrificial layer so as to expose a sidewall of said mushroom shaped silicon structure; and growing epitaxial silicon from said sidewall of said mushroom shaped silicon structure.

* * * * *